United States Patent
Zhu et al.

(10) Patent No.: US 9,368,701 B2
(45) Date of Patent: Jun. 14, 2016

(54) SEMICONDUCTOR STRUCTURE

(71) Applicants: Tsinghua University, Beijing (CN); HON HAI PRECISION INDUSTRY CO., LTD., New Taipei (TW)

(72) Inventors: Jun Zhu, Beijing (CN); Hao-Su Zhang, Beijing (CN); Zhen-Dong Zhu, Beijing (CN); Qun-Qing Li, Beijing (CN); Guo-Fan Jin, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 234 days.

(21) Appl. No.: 13/729,588

(22) Filed: Dec. 28, 2012

(65) Prior Publication Data
US 2013/0328085 A1    Dec. 12, 2013

(51) Int. Cl.
| | |
|---|---|
| *H01L 33/00* | (2010.01) |
| *H01L 33/58* | (2010.01) |
| *H01L 31/0216* | (2014.01) |
| *G02B 6/10* | (2006.01) |
| *H01L 31/068* | (2012.01) |
| *H01L 33/44* | (2010.01) |
| *H01L 31/056* | (2014.01) |
| *H01L 31/054* | (2014.01) |
| *H01L 33/22* | (2010.01) |

(52) U.S. Cl.
CPC ............... *H01L 33/58* (2013.01); *G02B 6/10* (2013.01); *H01L 31/0216* (2013.01); *H01L 31/02168* (2013.01); *H01L 31/056* (2014.12); *H01L 31/0547* (2014.12); *H01L 31/068* (2013.01); *H01L 33/44* (2013.01); *H01L 33/22* (2013.01); *Y02E 10/52* (2013.01); *Y02E 10/547* (2013.01)

(58) Field of Classification Search
CPC .......... H01L 33/44; H01L 33/00; H01L 33/22; G02B 1/007
USPC ........................................................ 257/98
See application file for complete search history.

(56) References Cited

U.S. PATENT DOCUMENTS

| | | |
|---|---|---|
| 2008/0006319 A1 | 1/2008 | Bettge et al. |
| 2008/0043475 A1* | 2/2008 | Bernkopf ............. 362/326 |

(Continued)

FOREIGN PATENT DOCUMENTS

| | | |
|---|---|---|
| TW | 201022461 | 6/2010 |
| TW | 201131824 | 9/2011 |

(Continued)

OTHER PUBLICATIONS

S Anantha Ramakrishna, "Physics of negative refractive index materials", Rep. Prog. Phys. 68 (2005) 449-521, Reports on Progress in Physics, Institute of Physics Publishing, 2005.*

*Primary Examiner* — Andy Huynh
*Assistant Examiner* — Sitaramarao S Yechuri
(74) *Attorney, Agent, or Firm* — Novak Druce Connolly Bove + Quigg LLP

(57) ABSTRACT

A semiconductor structure includes a first semiconductor layer, an active layer, a second semiconductor layer, and a cermet layer stacked together. The active layer is on a surface of the first semiconductor layer. The second semiconductor layer is on a surface of the active layer away from the first semiconductor layer. The cermet layer is on a surface of the second semiconductor layer away from the first semiconductor layer.

13 Claims, 15 Drawing Sheets

(56) References Cited

U.S. PATENT DOCUMENTS

| | | |
|---|---|---|
| 2010/0157437 A1* | 6/2010 | Higginson et al. ............ 359/652 |
| 2010/0314649 A1* | 12/2010 | Lin ................................ 257/98 |
| 2011/0073894 A1* | 3/2011 | Chu et al. ........................ 257/98 |
| 2011/0156088 A1 | 6/2011 | Moon et al. |
| 2012/0001152 A1 | 1/2012 | Kim et al. |
| 2012/0055534 A1* | 3/2012 | Leschkies et al. ............ 136/244 |
| 2012/0104440 A1 | 5/2012 | Peng et al. |

FOREIGN PATENT DOCUMENTS

| | | |
|---|---|---|
| TW | 201210067 | 3/2012 |
| TW | 201218419 | 5/2012 |

* cited by examiner

SEMICONDUCTOR STRUCTURE

CROSS-REFERENCE TO RELATED APPLICATIONS

This application claims all benefits accruing under 35 U.S.C. §119 from China Patent Application No. 201210185724.9, filed on Jun. 7, 2012, in the China Intellectual Property Office, the contents of which are hereby incorporated by reference. This application is related to commonly-assigned applications entitled, "METHOD FOR MAKING LIGHT EMITTING DIODE", filed on Dec. 28, 2012, with application Ser. No. 13/729,627; "LIGHT EMITTING DIODE", filed on Dec. 28, 2012, with application Ser. No. 13/729,617, the contents of the above commonly-assigned applications are hereby incorporated by reference.

BACKGROUND

1. Technical Field

The present disclosure relates to semiconductor structures, a light emitting diode, and a method for making the same.

2. Description of Related Art

Semiconductor structures fabricated by gallium nitride for light sources, such as blue, green, and white light sources, have long lifetime, high energy conversion efficiency, and are green. Therefore, the semiconductor structures are widely used as the light sources in large screen color display systems, automotive lighting, traffic lights, multimedia displays, optical communication systems, and so on.

A semiconductor structure used in a standard light emitting diode (LED) includes an N-type semiconductor layer, a P-type semiconductor layer, and an active layer located between the N-type semiconductor layer and the P-type semiconductor layer. In operation, a positive voltage and a negative voltage are applied respectively to the P-type semiconductor layer and the N-type semiconductor layer. Thus, holes in the P-type semiconductor layer and electrons in the N-type semiconductor layer can enter the active layer and combine with each other to emit visible light, and the visible light is emitted from the semiconductor structure. However, near field evanescent waves emitted from the active layer are internally reflected inside the semiconductor structure, so that a large portion of the light emitted from the active layer remain in the semiconductor structure, thereby degrading the light extraction efficiency of the LED.

What is needed, therefore, is to provide a semiconductor structure for solving the problem discussed above.

BRIEF DESCRIPTION OF THE DRAWING

Many aspects of the present disclosure can be better understood with reference to the following drawings. The components in the drawings are not necessarily to scale, the emphasis instead being placed upon clearly illustrating the principles of the present embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean at least one.

Figure 1:
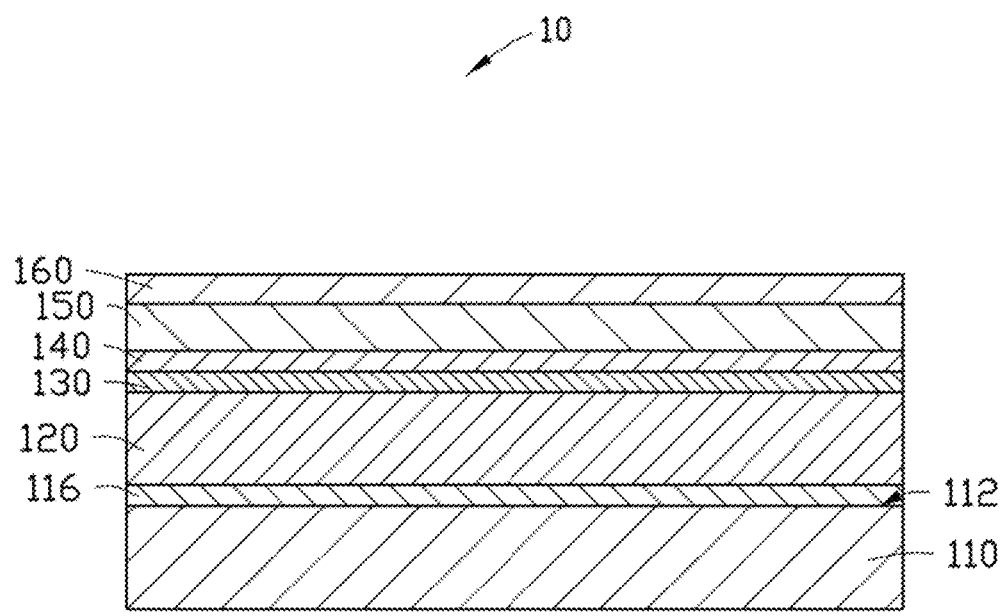
FIG. 1 is a schematic sectional view of one embodiment of a semiconductor structure.

Referring to FIG. 1, one embodiment of a semiconductor structure 10 includes a substrate 110 having an epitaxial growth surface 112, a buffer layer 116, a first semiconductor layer 120, an active layer 130, a second semiconductor layer 140, a protective layer 150, and a cermet layer 160. The buffer layer 116, the first semiconductor layer 120, the active layer 130, the second semiconductor layer 140, the protective layer 150, and the cermet layer 160 are stacked on the epitaxial growth surface 112 in that sequence.

The substrate 110 can be a transparent structure having an epitaxial growth surface 112 used to grow the first semiconductor layer 120. The epitaxial growth surface 112 is a smooth surface. Oxygen and carbon are removed from the epitaxial growth surface 112. The substrate 110 can be a single layer structure or a multiple layer structure. If the substrate 110 is a single layer structure, the substrate 110 can be a single-crystal structure. The single-crystal structure includes a crystal face which is used as the epitaxial growth surface 112. A material of the substrate 110 can be silicon on insulator (SOI), $LiGaO_2$, $LiAlO_2$, $Al_2O_3$, Si, GaAs, GaN, GaSb, InN, InP, InAs, InSb, AlP, AlAs, AlSb, AlN, GaP, SiC, SiGe, GaMnAs, GaAlAs, GaInAs, GaAlN, GaInN, AlInN, GaAsP, InGaN, AlGaInN, AlGaInP, GaP:Zn, or GaP:N. If the substrate 110 is the multiple layer structure, the substrate 110 should include at least one layer of the single-crystal structure mentioned previously. The material of the substrate 110 can be selected according to the first semiconductor layer 120. In one embodiment, a lattice constant and thermal expansion coefficient of the substrate 110 is similar to the first semiconductor layer 120 thereof to improve a quality of the first semiconductor layer 120. In one embodiment, the material of the substrate 110 is sapphire. A thickness, shape, and size of the substrate 110 are arbitrary and can be selected according to need.

The buffer layer 116 is sandwiched between the substrate 110 and the first semiconductor layer 120. A thickness of the buffer layer 116 ranges from about 10 nanometers to about 300 nanometers, such as about 20 nanometers and about 50 nanometers. A material of the buffer layer 116 can be GaN, or AlN with low melting point. In one embodiment, the material of the buffer layer 116 is GaN, and the thickness of the buffer layer 116 is about 20 nanometers.

A thickness of the first semiconductor layer 120 can be in a range from about 1 micrometer to about 15 micrometers. The first semiconductor layer 120 can be a doped semiconductor layer. The doped semiconductor layer can be an N-type semiconductor layer or a P-type semiconductor layer. A material of the N-type semiconductor layer can be at least one of N-type GaN, N-type GaAs, and N-type cupric phosphide. A material of the P-type semiconductor layer can be at least one of P-type GaN, P-type GaAs, and P-type cupric phosphide. The N-type semiconductor layer is configured to provide electrons, and the P-type semiconductor layer is configured to provide holes. In one embodiment, the material of the first semiconductor layer 120 is the N-type GaN doped with Si element, and the thickness of the first semiconductor layer 120 is about 1460 nanometers.

The active layer 130 is a photon excitation layer to provide a location for the combination of the electrons and holes. Photons are produced in the active layer 130 when the electrons and holes are combined. The active layer 130 can be one of a single layer quantum well film or multilayer quantum well film. A material of the quantum well film can be at least one of GaInN, AlGaInN, GaAs, GaAlAs, GaInP, InAsP, and InGaAs. A thickness of the active layer 130 can be in a range from about 0.01 micrometers to about 0.6 micrometers. In one embodiment, the material of the active layer 130 is a composition of InGaN and GaN, and the thickness of the active layer 130 is about 10 nanometers.

The second semiconductor layer 140 can be the N-type semiconductor layer or the P-type semiconductor layer. The type of the first semiconductor layer 120 and the type of the second semiconductor layer 140 is different to form a PN conjunction. The second semiconductor layer 140 is located on the active layer 130. A thickness of the second semiconductor layer 140 ranges from about 5 nanometers to about 250 nanometers. In one embodiment, the thickness of the second semiconductor layer 140 ranges from about 10 nanometers to about 200 nanometers. In one embodiment, the thickness of the second semiconductor layer 140 is in a range from about 10 nanometers to about 30 nanometers. The thickness of the second semiconductor layer 140 can be about 10 nanometers, about 50 nanometers, about 100 nanometers, or about 200 nanometers. In one embodiment, the second semiconductor layer 140 is the P-type GaN doped with Mg element, and the thickness of the second semiconductor layer 140 is about 10 nanometers. In one embodiment, the refractive index of the composite semiconductor layer 200 is about 2.5.

The protective layer 150 is located on the second semiconductor layer 140. The protective layer 150 is sandwiched between the second semiconductor layer 140 and the cermet layer 160. The protective layer 150 can prevent the metallic plasma generated by the cermet layer 160 from converting to heat. The refractive index of the cermet layer 160 under a guided wave mode is a complex number including a real part and an imaginary part. If the imaginary part is large, the metallic plasma is easily converted to heat. Thus, the protective layer 150 is made of a material with a low refractive index and can reduce the real part and the imaginary part at the same time. Thus, the heat consumption of the metallic plasma can be reduced, and the metallic plasma can travel farther. Therefore, the extraction efficiency of the semiconductor structure 10 can be increased. In one embodiment, the refractive index of the protective layer 150 can be in a range from about 1.2 to about 1.5. In one embodiment, the refractive index of the protective layer 150 is in a range from about 1.3 to about 1.4. In one embodiment, the refractive index of the protective layer 150 is in a range from about 1.4 to about 1.5. The material of the protective layer 150 can be silicon dioxide, magnesium fluoride, or lithium fluoride. In one embodiment, the material of the protective layer 150 is silicon dioxide, and the refractive index of the protective layer 150 is about 1.5.

A thickness of the protective layer 150 can be in a range from about 5 nanometers to about 40 nanometers. In one embodiment, the thickness of the protective layer 150 is in a range from about 5 nanometers to about 10 nanometers. In one embodiment, the thickness of the protective layer 150 is in a range from about 10 nanometers to about 20 nanometers. In one embodiment, the thickness of the protective layer 150 is in a range from about 20 nanometers to about 30 nanometers. In one embodiment, the thickness of the protective layer 150 is in a range from about 30 nanometers to about 40 nanometers. The thinner the protective layer 150, the closer the cermet layer 160 and active layer 130. Therefore, the interaction between the cermet layer 160 and the active layer 130 will be improved, and more photos will be generated by the active layer 130. In one embodiment, the thickness of the protective layer 150 is about 20 nanometers.

A material of the cermet layer 160 can be selected to ensure that the cermet layer 160 can generate metallic plasma. Therefore, the material of the cermet layer 160 is metallic in optics. Furthermore, the material of the cermet layer 160 can satisfy the following requirements. First, the refractive index of the cermet layer 160 is a complex number including a real part and an imaginary part, and the imaginary part cannot be zero. Second, a dielectric constant of the cermet layer 160 is a complex number including a real part and an imaginary part, and the real part is a negative number.

The material of the cermet layer 160 can be a metallic composite, and the metallic composite can include a metal material and a dielectric material, such as metal ceramic. Thus lights with long wavelengths can be easily extracted from the active layer 130. The metal can be silver, aluminum, copper or gold. The alloy can be gold-silver alloy, gold-aluminum alloy, or silver-aluminum alloy. The dielectric material can be silicon, silicon dioxide, or ceramic. A mass percent of the dielectric material in the metallic composite can be less than or equal to 40%, such as about 35%, about 30%, about 25%, about 20%, about 15%, about 10%, or about 5%. In one embodiment, the metal in the cermet layer 160 is silver, and the dielectric material is silicon dioxide. A thickness of the cermet layer 160 can be in a range from about 50 nanometers to about 100 nanometers. The thickness of the cermet layer 160 can be selected to ensure that the photons generated by the active layer 130 can be extracted out through the substrate 110. In one embodiment, the thickness of the cermet layer 160 is about 50 nanometers.

Furthermore, the substrate 110 is optional and can also be omitted from the semiconductor structure 10.

The cermet layer 160 has many functions. Near field evanescent waves generated by the active layer 130 can be amplified and converted to metallic plasma by the cermet layer 160, when arriving at the cermet layer 160. The metallic plasma can be extracted out of the semiconductor structure 10 through the substrate 110. A few metallic plasma can be scattered by the cermet layer 160 and spread around the cermet layer 160. While the metallic plasma reaches the active layer 130, the metallic plasma can interact with the quantum well in the active layer 130 to activate more secondary photons. The secondary photons can also arrive at the cermet layer 160 and introduce more metallic plasma. Thus, more photons can be extracted out of the semiconductor structure 10 under the interaction between the cermet layer 160 and the active layer 130. Furthermore, the uniformity of the current distributed in the second semiconductor layer 140 can be improved.

Figure 2:
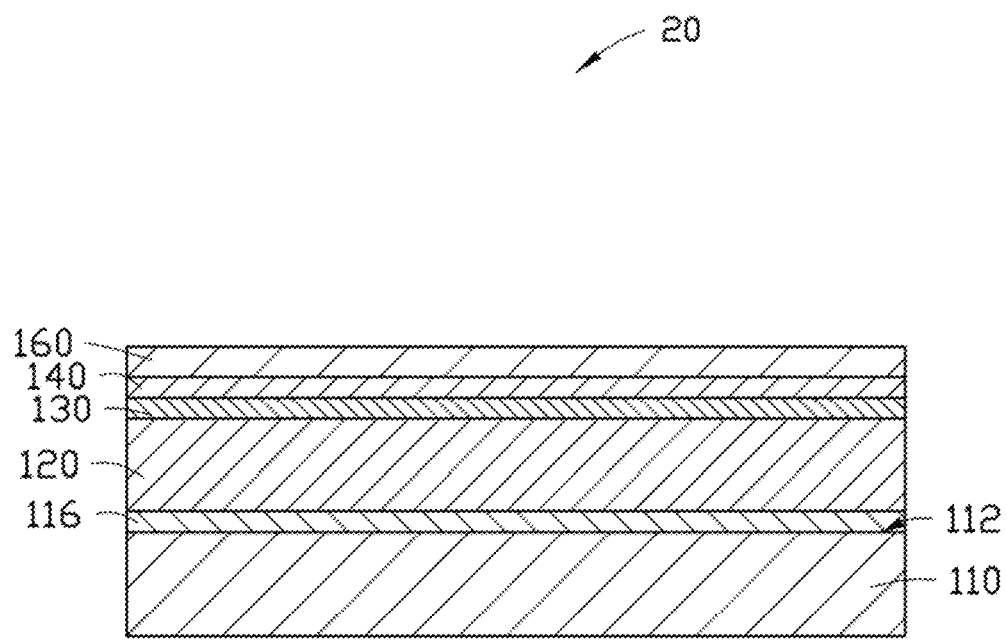
FIG. 2 is a schematic sectional view of one embodiment of a semiconductor structure.

Also referring to FIG. 2, one embodiment of a semiconductor structure 20 is provided. The semiconductor structure 20 includes a substrate 110 having an epitaxial growth surface 112, a buffer layer 116, a first semiconductor layer 120, an active layer 130, a second semiconductor layer 140, and a cermet layer 160. The buffer layer 116, the first semiconductor layer 120, the active layer 130, the second semiconductor layer 140, and the cermet layer 160 are stacked on the epitaxial growth surface 112 in that sequence.

The semiconductor structure 20 is similar to the semiconductor structure 10, except that the protective layer 150 is omitted. The cermet layer 160 is directly located on a surface of the second semiconductor layer 140. Thus a distance between the cermet layer 160 and the active layer 130 is reduced, and the interaction between them is improved.

Figure 3:
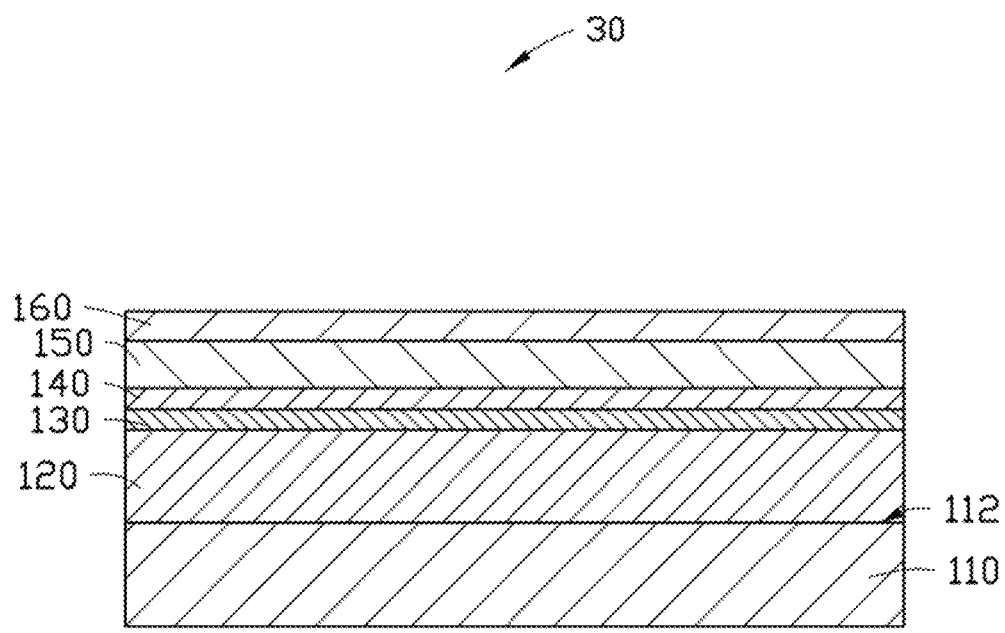
FIG. 3 is a schematic sectional view of one embodiment of a semiconductor structure.

Referring to FIG. 3, one embodiment of a semiconductor structure 30 includes a substrate 110 having an epitaxial growth surface 112, a first semiconductor layer 120, an active layer 130, a second semiconductor layer 140, a protective layer 150, and a cermet layer 160. The first semiconductor layer 120, the active layer 130, the second semiconductor layer 140, the protective layer 150, and the cermet layer 160 are stacked on the epitaxial growth surface 112 in that sequence.

The semiconductor structure 30 is similar to the semiconductor structure 10, except that the buffer layer 116 is omitted. The first semiconductor layer 120 is directly located on the epitaxial growth surface 112 of the substrate 110.

Figure 4:
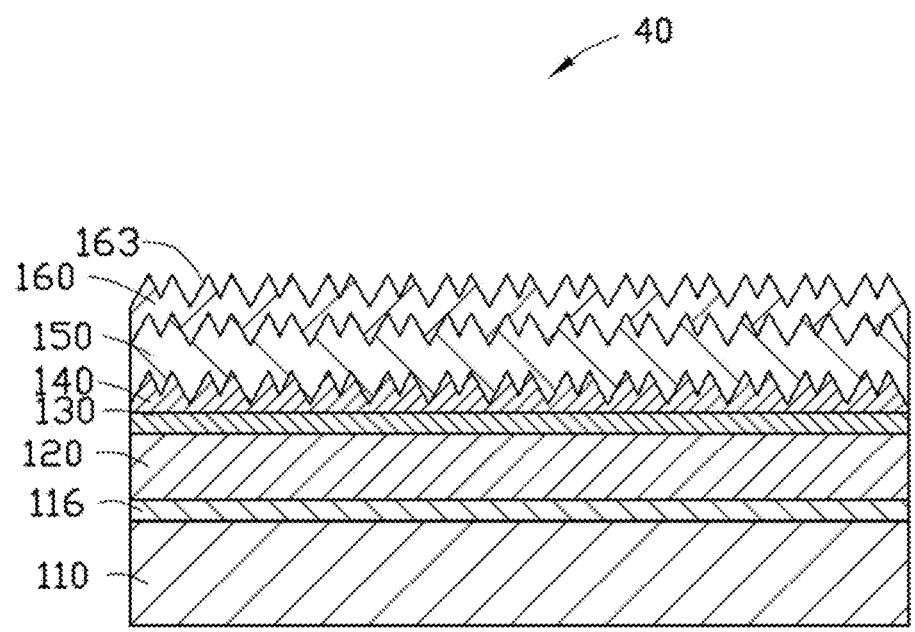
FIG. 4 is a schematic sectional view of one embodiment of a semiconductor structure.

Referring to FIG. 4, one embodiment of a semiconductor structure 40 is provided. The semiconductor structure 40 includes a first semiconductor layer 120, an active layer 130, a second semiconductor layer 140, a protective layer 150, and a cermet layer 160 stacked in that order. The semiconductor structure 40 is similar to the semiconductor structure 20, except that a surface of the second semiconductor layer 140 away from the active layer 130 includes a plurality of primary three-dimensional nano-structures 143.

Figure 5:
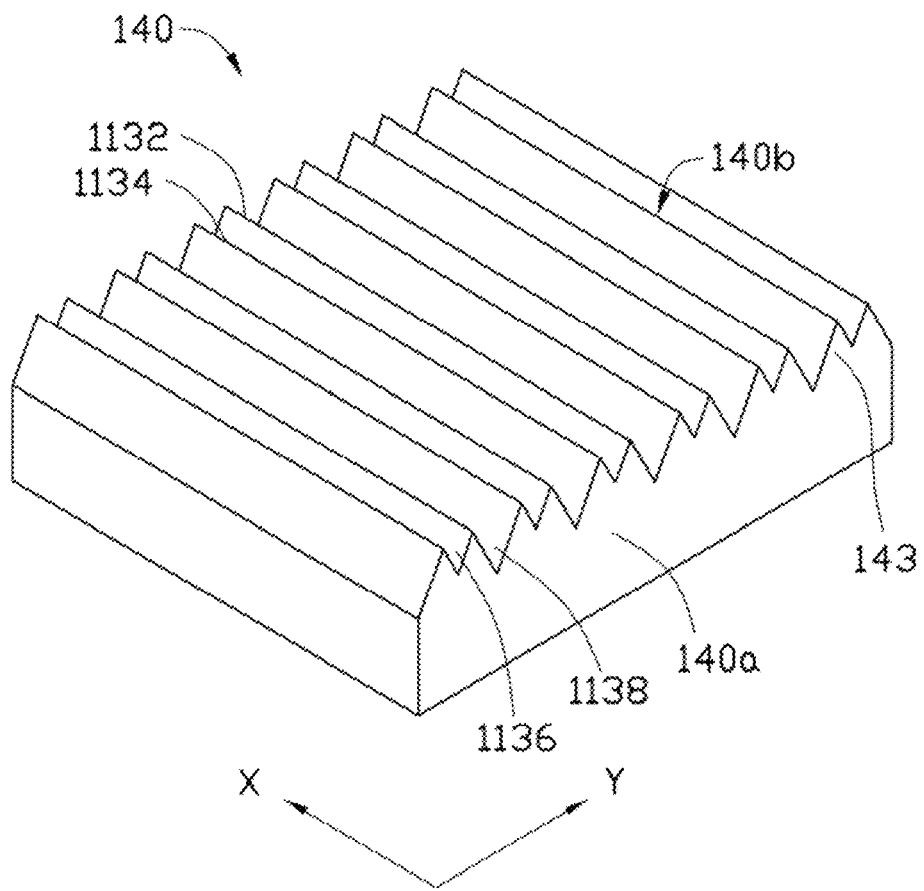
FIG. 5 is a schematic sectional view of one embodiment of a three dimensional structure array of FIG. 4.

Also referring to FIG. 5, the second semiconductor layer 140 can be separated into a main body 140a and a protruding part 140b and distinguished by an "interface." The interface can be parallel with the first surface of the second semiconductor layer 140. The interface is configured as a surface of the main body 140a, and the protruding part 140b is extending away from the interface. The protruding part 140b defines the plurality of primary three-dimensional nano-structures 143, and the plurality of primary three-dimensional nano-structures 143 form the patterned surface of the second semiconductor layer 140. The three-dimensional nano-structure 143 can be a protruding structure. The protruding structure protrudes out from the interface of the main body 140a. The plurality of primary three-dimensional nano-structures 143 is a protruding structure located on the interface of the main body 140a.

Figure 6:
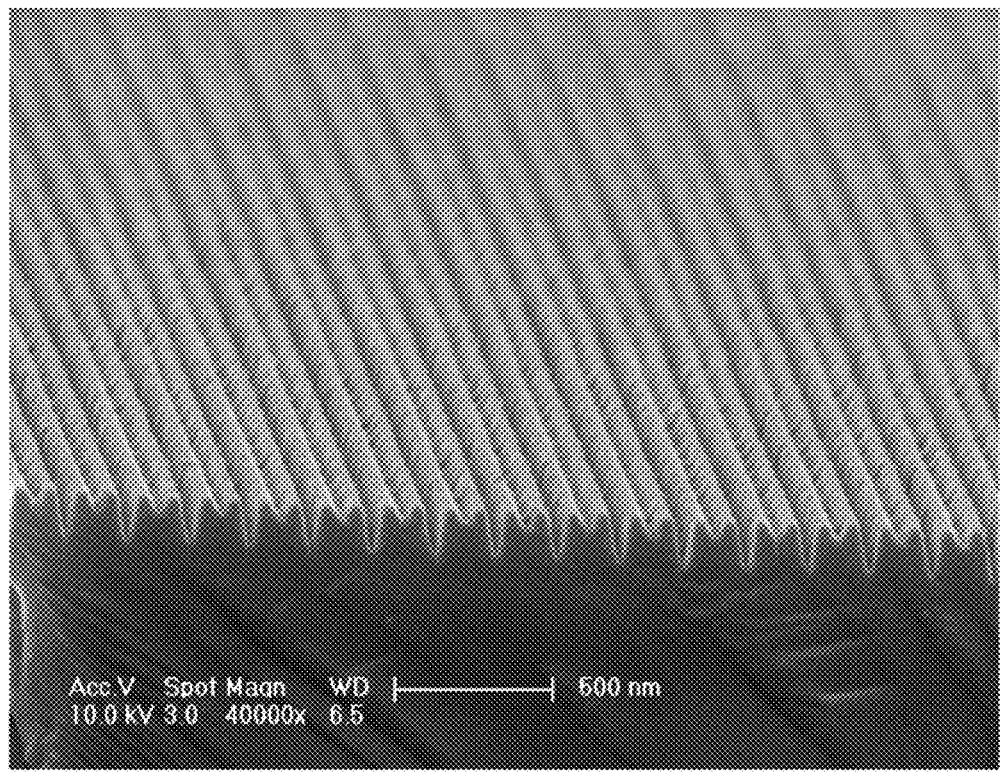
FIG. 6 is a scanning electron microscope image of FIG. 5.

The plurality of primary three-dimensional nano-structures 143 can be arranged side by side. Each of the primary three-dimensional nano-structures 143 can extend along a straight line, a curvy line, or a polygonal line. The extending direction is substantially parallel with the surface of the second semiconductor layer 140. The two adjacent three-dimensional nano-structures are arranged a certain distance apart from each other. The distance ranges from about 0 nanometers to about 1000 nanometers, such as about 10 nanometers, about 30 nanometers, or about 200 nanometers. The extending direction of the three-dimensional nano-structure 143 can be fixed or varied. While the extending direction of the three-dimensional nano-structure 143 is fixed, the plurality of primary three-dimensional nano-structures 143 extends along a straight line. Otherwise the primary three-dimensional nano-structures 143 extends along a polygonal line or a curvy line. The cross-section of the three-dimensional nano-structure 143 along the extending direction is M-shaped. Referring to FIG. 5 and FIG. 6, the primary three-dimensional nano-structures 143 are a plurality of substantially parallel bar-shaped protruding structures extending along a straight line. The plurality of primary three-dimensional nano-structures 143 are substantially uniformly and equidistantly distributed on the entire surface of the main body 140a.

The three-dimensional nano-structure 143 extends from one side of the second semiconductor layer 140 to the opposite side along the X direction. The Y direction is substantially perpendicular to the X direction and substantially parallel with the surface of the main body 140a. The three-dimensional nano-structure 143 is a double-peak structure including two peaks. The cross-section of the double-peak structure is in the shape of an M. Each M-shaped three-dimensional nano-structure 143 includes a first peak 1132 and a second peak 1134. The first peak 1132 and the second peak 1134 extend substantially along the X direction. A first groove 1136 is defined between the first peak 1132 and the second peak 1134. A second groove 1138 is defined between two adjacent primary three-dimensional nano-structures 143.

The first peak 1132 and the second peak 1134 protrude out of the main body 140a. The height of the first peak 1132 and the second peak 1134 is arbitrary and can be selected according to need. In one embodiment, both the height of the first peak 1132 and that of the second peak 1134 range from about 150 nanometers to about 200 nanometers. The height of the first peak 1132 can be substantially equal to that of the second peak 1134. The highest points of the first peak 1132 and the second peak 1134 are defined as the farthest point away from the surface of the main body 140a. In one three-dimensional nano-structure 143, the highest point of the first peak 1132 is spaced from that of the second peak 1134 a certain distance ranging from about 20 nanometers to about 100 nanometers. The first peak 1132 and the second peak 1134 extend substantially along the X direction. The cross-section of the first peak 1132 and the second peak 1134 can be trapezoidal or triangular, and the shape of the first peak 1132 and the second peak 1134 can be substantially the same. In one embodiment, the cross-sections of the first peak 1132 and the second peak 1134 are triangular. In one embodiment, the first peak 1132, the second peak 1134, and the main body 140a form an integrated structure.

In each M-shaped three-dimensional nano-structure 143, the first peak 1132 and the second peak 1134 define the first groove 1136. The extending direction of the first groove 1136 is substantially the same as the extending direction of the first peak 1132 and the second peak 1134. The cross-section of the first groove 1136 is V-shaped. The depth $h_1$ of the first groove 1136 in each three-dimensional nano-structure 143 is substantially the same. The depth $h_1$ is defined as the distance between the highest point of the first peak 1132 and the lowest point of the first groove 1136. The depth of the first groove 1136 is less than the height of the first peak 1132 and the second peak 1134.

The second groove 1138 extends substantially along the extending direction of the primary three-dimensional nano-structures 143. The cross-section of the second groove 1138 is V-shaped or an inverse trapezium. Along the extending direction, the cross-section of the second groove 1138 is substantially the same. The depth $h_2$ of the second grooves 1138 between adjacent primary three-dimensional nano-structures 143 is substantially the same. The depth $h_2$ is defined as the distance between the highest point and the lowest point of the groove of the second groove 1138. The depth of the second groove 1138 is greater than the depth of the first groove 1136, and the ratio between $h_1$ and $h_2$ ranges from about 1:1.2 to about 1:3 ($1:1.2 \leq h_1:h_2 \leq 1:3$). The depth of the first groove 1136 ranges from about 30 nanometers to about 120 nanometers, and the depth of the second groove 1138 ranges from about 90 nanometers to about 200 nanometers. In one embodiment, the depth of the first groove 1136 is about 80 nanometers, and the depth of the second groove 1138 is about 180 nanometers. The depth of the first groove 1136 and the second groove 1138 can be selected according to need.

The protective layer 150 and the cermet layer 160 are stacked on the patterned surface of the second semiconductor conductive layer 140. Furthermore, the surface of the protective layer 150, and the surface of the cermet layer 160 away from the active layer 130 can also form a secondary patterned surface. The secondary patterned surface is similar to the patterned surface of the second semiconductor layer 140. The secondary patterned surface also includes a plurality of secondary three-dimensional nano-structures 163, and the distribution and the alignment of the secondary three-dimensional nano-structures 163 are the same as the distribution and the alignment of primary three-dimensional nano-structures 143.

Furthermore, if the protective layer 150 is omitted, the cermet layer 160 is directly located on the surface of the second semiconductor layer 140. The surface of the cermet layer 160 away from the cermet layer 160 can also form the plurality of secondary three-dimensional nano-structures 163.

The semiconductor structure has many advantages. First, the plurality of primary three-dimensional nano-structures 143 change the motion direction of the photons reaching the light emitting surface with a large incident angle, so that these photons can be extracted from the light emitting surface. Second, the metallic plasma can be scattered by the plurality of well aligned three-dimensional nanostructures 143 on the cermet layer, thus the metallic plasma can be easily extracted. Third, because the three-dimensional nano-structure 143 is M-shaped, the M-shaped primary three-dimensional nano-structures 143 can function as two layers of the three-dimensional nano-structure assembled together. The light extraction efficiency of the semiconductor structure will be improved.

Furthermore, the surface of the first semiconductor layer 120 adjacent to the active layer 130 can also be a patterned surface including a plurality of three-dimensional nanostructures (now shown). Therefore, the contact area between the first semiconductor layer 120 and the active layer 130 can be enlarged. The electron-hole recombination density is improved, and the quantity of photons is increased. The light extraction efficiency of the semiconductor structure 30 can be improved.

Figure 7:
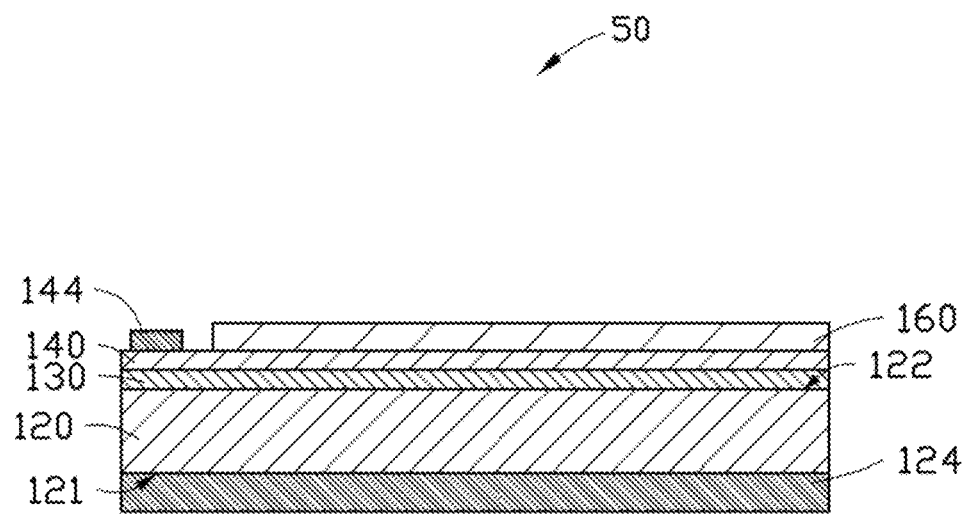
FIG. 7 is a schematic view of one embodiment of an LED.

Also referring to FIG. 7, one embodiment of an LED 50 includes a first semiconductor layer 120, an active layer 130, a second semiconductor layer 140, and a cermet layer 160 stacked in that order. The first semiconductor layer 120 includes a first surface 121 and a second surface 122 opposite to the first surface. The active layer 130 is located on the second surface 122. A first electrode 124 covers and directly contacts the first surface 121 of the first semiconductor layer 120 away from the active layer 130. A second electrode 144 is electrically connected to the second semiconductor layer 140. In one embodiment, a part of the surface of the second semiconductor layer 140 is exposed, and the second electrode 144 is located on the exposed surface of the second semiconductor layer 140.

The first electrode 124 is electrically connected with the first semiconductor layer 120. The first electrode 124 can cover the entire surface of the first semiconductor layer 120 away from the active layer 130. Thus the LED 50 forms a vertical structure, and the current diffusion speed will be improved and the heat produced in the LED 50 will be decreased. The first electrode 124 is a single layer structure or a multi-layer structure. The first electrode 124 can be an N-type electrode or a P-type electrode according to the first semiconductor layer 120. The material of the first electrode 124 can be selected from Ti, Ag, Al, Ni, Au, or any combination of them. The material of the first electrode 124 can also be indium-tin oxide (ITO) or carbon nanotube film. In one embodiment, the first electrode 124 is a two-layer structure consisting of a Ti layer with about 15 nm in thickness and an Au layer with about 100 nm in thickness.

The second electrode 144 can be an N-type electrode or a P-type electrode. The type of the second electrode 144 is the same as the second semiconductor layer 140. The shape of the second electrode 144 is arbitrary and can be selected according to need. The second electrode 144 covers at least part of the surface of the second semiconductor layer 140. The second electrode 130 can cover at least part of the three-dimensional nano-structures 142. The shape and the location of the second electrode 144 cannot affect the light extraction efficiency of the LED 50. The second electrode 144 is a single layer structure or a multi-layer structure. The material of the second electrode 144 can be selected from Ti, Ag, Al, Ni, Au or any combination of them. The material of the second electrode 144 can also be ITO. In one embodiment, the second electrode 144 is transparent to reduce the reflectivity and the absorption, thus improving the light extraction efficiency.

Figure 8:
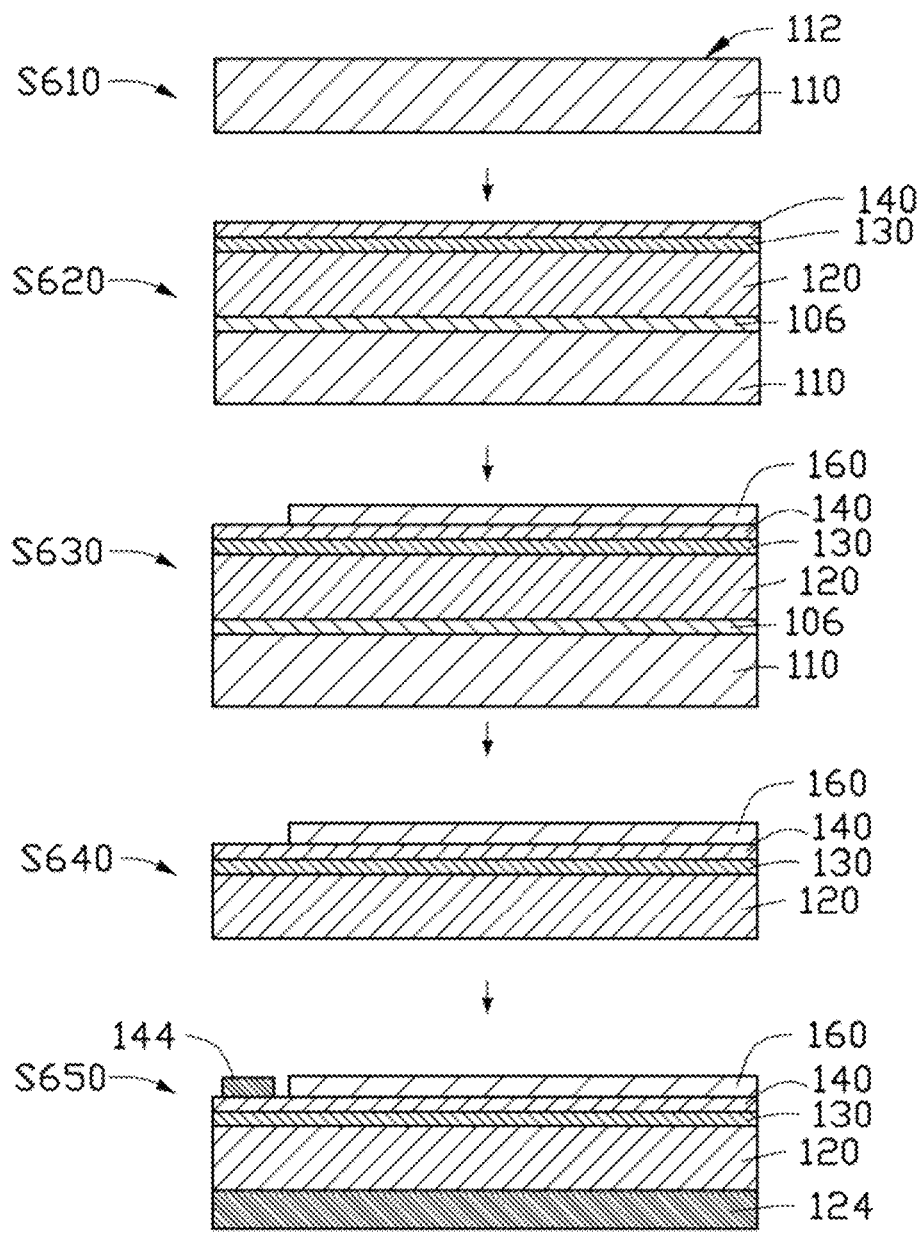
FIG. 8 is a flowchart of one embodiment of a method for making the LED of FIG. 7.

Also referring to FIG. 8, one embodiment of a method for making the LED 50 includes the following steps:

(S610), providing a substrate 110 having an epitaxial growth surface 112;

(S620), growing a first semiconductor layer 120, an active layer 130, and a second semiconductor layer 140 on the epitaxial growth surface 112 in that order;

(S630), applying a cermet layer 160 on the second semiconductor layer 140;

(S640), removing the substrate 110 to expose a surface of the first semiconductor layer 120; and (S650), applying a first electrode 124 to cover the exposed surface of the first semiconductor layer 120, and a second electrode 144 electrically connected to the second semiconductor layer 140.

In step (S620), the first semiconductor layer 120, the active layer 130 and the second semiconductor layer 140 can be grown respectively via a process of molecular beam epitaxy (MBE), chemical beam epitaxy (CBE), vacuum epitaxy, low temperature epitaxy, choose epitaxy, liquid phase deposition epitaxy (LPE), metal organic vapor phase epitaxy (MOVPE), ultra-high vacuum chemical vapor deposition (UHVCVD), hydride vapor phase epitaxy (HYPE), and metal organic chemical vapor deposition (MOCVD).

In one embodiment, the first semiconductor layer 120 is Si-doped N-type GaN. The first semiconductor layer 120 is made by a MOCVD method, and the growth of the first semiconductor layer 120 is a heteroepitaxial growth. In the MOCVD method, the nitrogen source gas is high-purity ammonia ($NH_3$), the carrier gas is hydrogen ($H_2$), the Ga source gas is trimethyl gallium (TMGa) or triethyl gallium (TEGa), and the Si source gas is silane ($SiH_4$). The growth method of the active layer 130 is similar to the first semiconductor layer 120. In one embodiment, the indium source gas is trimethyl indium. The second semiconductor layer 140 is grown after the growth of the active layer 130. In one embodiment, the Mg source gas is ferrocene magnesium ($Cp_2Mg$).

In step (S630), the cermet layer 160 can be deposited on the second semiconductor layer 140 by sputtering or vacuum evaporation. In one embodiment, the material of the cermet layer 160 includes silver and silicon dioxide. The cermet layer 160 can be deposited on the second semiconductor layer by the following method:

(S631), providing a melted silver and a melted silicon dioxide;

(S632), forming a melted alloy by mixing the melted silver and the melted silicon dioxide, wherein the mass percent of the melted silicon dioxide is about 20%; and (S633), evaporating the melted alloy and depositing the melted alloy on the second semiconductor layer 140.

In step (S640), the substrate 110 can be removed by laser irradiation, etching, or thermal expansion and contraction. The removal method can be selected according to the material of the substrate 110 and the first semiconductor layer 120. In one embodiment, the substrate 110 is removed by laser irradiation. The substrate 110 can be removed from the first semiconductor layer 120 by the following steps:

(S641) polishing and cleaning the surface of the substrate 110 away from the first semiconductor layer 120;

(S642) placing the substrate 110 on a platform (not shown) and irradiating the substrate 110 and the first semiconductor layer 120 with a laser; and (S643) immersing the substrate 110 into a solvent and removing the substrate 110.

In step (S641), the substrate 110 can be polished by a mechanical polishing method or a chemical polishing method to obtain a smooth surface. Thus the scatting of the laser will be decreased. The substrate 110 can be cleaned with hydrochloric acid or sulfuric acid to remove the metallic impurities and oil.

In step (S642), the substrate 110 is irradiated by the laser from the polished surface, and the incidence angle of the laser is substantially perpendicular to the surface of the substrate 110. The wavelength of the laser is selected according to the material of the first semiconductor layer 120 and the substrate 110. The energy of the laser is smaller than the bandgap energy of the substrate 110 and larger than the bandgap energy of the first semiconductor layer 120. Thus the laser can pass through the substrate 110 and reach the interface between the substrate 110 and the first semiconductor layer 120. The buffer layer at the interface has a strong absorption of the laser, and the temperature of the buffer layer will be raised rapidly. Thus the buffer layer will be decomposed. In one embodiment, the bandgap energy of the first semiconductor layer 120 is about 3.3 eV, and the bandgap energy of the substrate 110 is about 9.9 eV. The laser is a KrF laser, the wavelength of the laser is about 248 nm, the energy is about 5 eV, the pulse width range is about 20 nanoseconds to about 40 nanoseconds, the energy density ranges from about 400 $mJ/cm^2$ to about 600 $mJ/cm^2$, and the shape of the laser pattern is square with a size of about 0.5 mm×0.5 mm. The laser moves from one edge of the substrate 110 with a speed of about 0.5 mm/s. During the irradiating process, the GaN is decomposed to Ga and $N_2$. The parameter of the laser and the wavelength of the laser can be selected according to the absorption of the buffer layer.

Because the buffer layer has a strong absorption of the laser, the buffer layer can decompose rapidly. However, the first semiconductor layer 120 has a weak absorption, so it does not decompose quickly. The irradiating process can be performed in a vacuum or a protective gas environment. The protective gas can be nitrogen, helium, argon, or other inert gas.

In step (S643), the substrate 110 can be immersed into an acidic solution to remove the Ga decomposed from GaN so that the substrate 110 can be peeled off from the first semiconductor layer 120. The acidic solution can be hydrochloric acid, sulfuric acid, or nitric acid which can dissolve the Ga.

In step (S650), the first electrode 124 and the second electrode 144 can be formed via a process of physical vapor deposition, such as electron beam evaporation, vacuum evaporation, ion sputtering, or any physical deposition. Furthermore, a conductive substrate (not shown) can be directly attached on and electrically connected to the first semiconductor layer 120, and the conductive substrate can be used as the first electrode 124.

Figure 9:
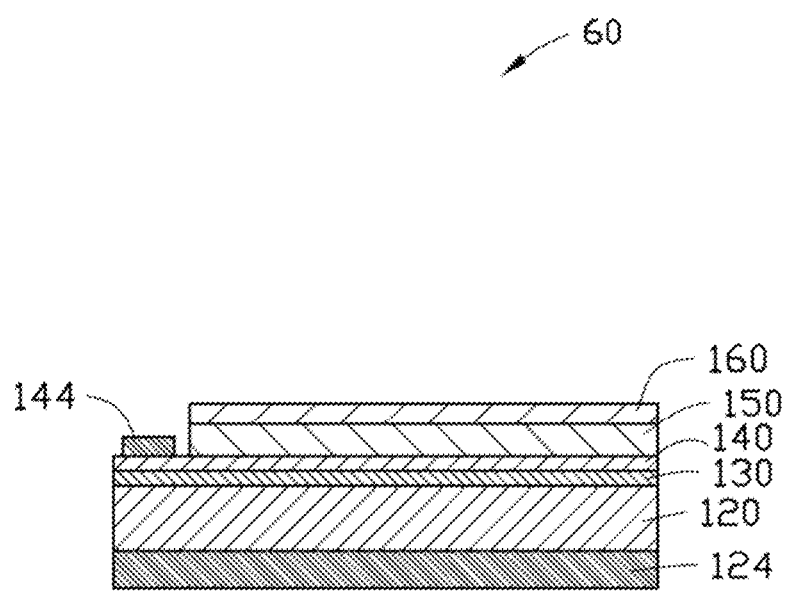
FIG. 9 is a schematic view of one embodiment of an LED.

Also referring to FIG. 9, one embodiment of an LED 60 includes a first semiconductor layer 120, an active layer 130, a second semiconductor layer 140, a protective layer 150, and a cermet layer 160 stacked in that order. The first semiconductor layer 120 includes a first surface 121 and a second surface 122 opposite to the first surface. The active layer 130 is located on the second surface 122. A first electrode 124 covers and directly contacts the first surface 121 of the first semiconductor layer 120 away from the active layer 130. A second electrode 144 is electrically connected to the second semiconductor layer 140. In one embodiment, a part surface of the second semiconductor layer 140 is exposed, and the second electrode 144 is located on the exposed surface of the second semiconductor layer 140.

The structure of the LED 60 is similar to the structure of the LED 50, except that the LED 60 further includes a protective layer 150 sandwiched between the second semiconductor layer 140 and the cermet layer 160.

Figure 10:
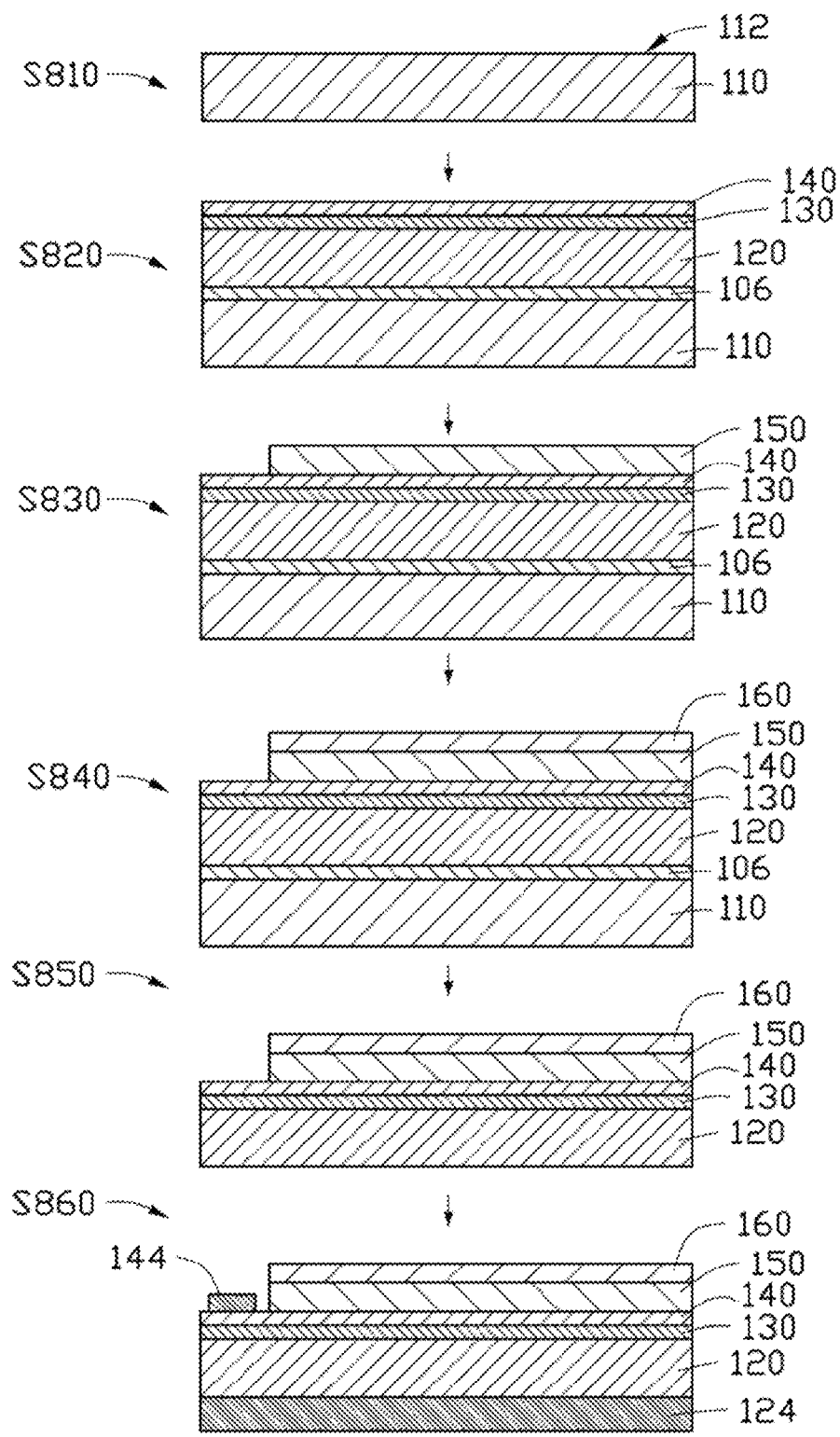
FIG. 10 is a flowchart of one embodiment of a method for making the LED of FIG. 9.

Also referring to FIG. 10, one embodiment of a method for making the LED 60 includes the following steps:

(S810), providing a substrate 110 having an epitaxial growth surface 112;

(S820), growing a first semiconductor layer 120, an active layer 130, and a second semiconductor layer 140 on the epitaxial growth surface 112 in that order;

(S830), applying a protective layer 150 on the second semiconductor layer 140;

(S840), applying a cermet layer 160 on the protective layer 150;

(S850), removing the substrate 110 to expose a surface of the first semiconductor layer 120; and (S860), applying a first electrode 124 to cover the exposed surface of the first semiconductor layer 120, and a second electrode 144 electrically connected to the second semiconductor layer 140.

The method of making the LED 60 is similar to the method of making the LED 50, except an additional step of locating the protective layer 150 on the second semiconductor layer 140. The protective layer 150 can be deposited on the second semiconductor layer 140 via sputtering, chemical vapor deposition, or vacuum evaporation. In one embodiment, a material of the protective layer 150 is silicon dioxide, and the thickness of the protective layer 150 is about 130 nanometers. The protective layer 150 can be deposited on the second semiconductor layer 140 via chemical vapor deposition.

Figure 11:
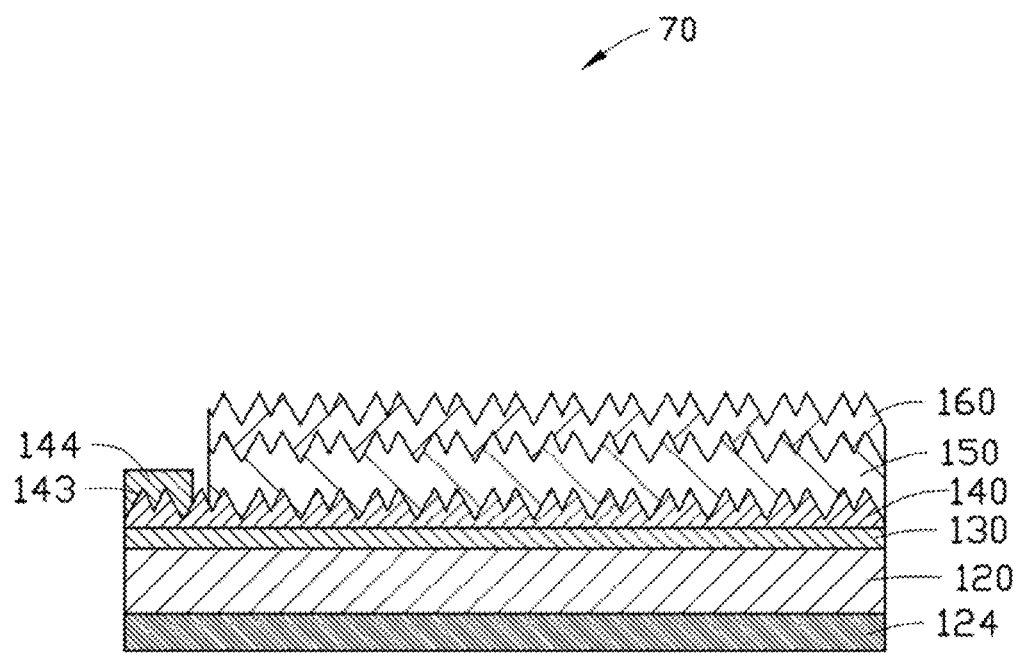
FIG. 11 is a schematic view of one embodiment of an LED.

Also referring to FIG. 11, one embodiment of an LED 70 includes a first semiconductor layer 120, an active layer 130, a second semiconductor layer 140, a protective layer 150, and a cermet layer 160 stacked in that order. The first semiconductor layer 120 includes a first surface 121 and a second surface 122 opposite to the first surface. The active layer 130 is located on the second surface 122. A first electrode 124 covers and directly contacts the first surface 121 of the first semiconductor layer 120 away from the active layer 130. A second electrode 144 is electrically connected to the second semiconductor layer 140.

The structure of the LED 70 is similar to the structure of the LED 60, except that the second semiconductor layer 140 further includes a plurality of primary three-dimensional nano-structures 143. The plurality of primary three-dimensional nano-structures 143 is applied on the surface of the second semiconductor layer 140 away from the active layer 130. The structure of the plurality of primary three-dimensional nano-structures 143 of LED 70 is similar to that in the semiconductor structure 30. Thus the light extractive efficiency of LED 70 will be improved. Referring to FIG. 11, the light extractive efficiency of LED 70 is much greater than that of the standard LED and the standard only with three-dimensional nano-structures.

Furthermore, the plurality of three-dimensional nano-structures can also be applied on a surface of the first semiconductor layer 120 adjacent to the active layer 130, or a surface of the active layer 130 adjacent to the second semiconductor layer 140. Therefore, the contact area between the first semiconductor layer 120 and the active layer 130, or between the second semiconductor layer 140 and the active layer 130, can be enlarged. The electron-hole recombination density is improved, and the quantity of photons is increased. The light extraction efficiency of the LED 70 can be improved.

The method of one embodiment of making the LED 70 includes:

(S710), providing a substrate 110 having an epitaxial growth surface 112;

(S720), growing a first semiconductor layer 120, an active layer 130, and a second semiconductor layer 140 on the epitaxial growth surface 112 in that order;

(S730), forming a plurality of three-dimensional nano-structures 133 on a surface of the second semiconductor layer 140 away from the active layer 130;

(S740), forming a protective layer 150 on the plurality of primary three-dimensional nano-structures 143;

(S750), applying a cermet layer 160 on the protective layer 150;

(S760), removing the substrate 110 to expose a surface of the first semiconductor layer 120; and (S770), applying a first electrode 124 to cover the exposed surface of the first semiconductor layer 120, and a second electrode 144 electrically connected to the second semiconductor layer 140.

The method of making LED 70 is similar to the method of making LED 60, except the method further comprises a step of forming a plurality of primary three-dimensional nano-structures 143 on the second semiconductor layer 140.

In step (S730), the plurality of primary three-dimensional nano-structures 143 can be formed by:

(S731), locating a mask layer on the surface of the second semiconductor layer 140;

(S732), patterning the mask layer by a nanoimprinting and etching method;

(S733), patterning the surface of the second semiconductor layer 140 by an etching method to form a plurality of three-dimensional nano-structure performs; and (S734), forming the plurality of the primary three-dimensional nano-structures 143 by removing the mask layer.

In step (S731), the mask layer can be a single layered structure or a multi-layered structure. In one embodiment, the mask layer is the multi-layered structure including a first mask layer and a second mask layer disposed on a surface of the first mask layer. The first mask layer and the second mask layer are stacked on the surface of the second semiconductor layer 140 in sequence. A material of the first mask layer is ZEP520A® which is developed by Zeon Corp of Japan, a material of the second mask layer is HSQ (hydrogen silsesquioxane).

In step (S732), the mask layer can be patterned by the following steps:

(S7321), providing a patterned template, which includes a plurality of protruding structures spaced from and substantially parallel with each other, and a slot is defined between the two adjacent protruding structure;

(S7322), attaching the template on the second mask layer, and pressing the template at room temperature and removing the template to form a plurality of slots on the second mask layer;

(S7323), removing the residual second mask layer in the bottom of the slot to expose the first mask layer, and (S7324), patterning the mask layer by removing one part of the first mask layer corresponding with the slots to expose the second semiconductor layer 140.

In step (S733), the second semiconductor layer 140 can be placed in an inductively coupled plasma device and etched by an etching gas. In one embodiment, the etching gas is a mixed gas. The mixed gas can include $Cl_2$, $BCl_3$, $O_2$ and Ar. A power of the inductively coupled plasma device ranges from about 10 watts to about 100 watts, a flow speed of the etching gas ranges from about 8 sccm to about 150 sccm, a pressure of the etching gas can range from about 0.5 Pa to about 15 Pa, and an etching time can range from about 5 seconds to about 5 minutes. In one embodiment, the flow speed of the $Cl_2$ is about 26 sccm, the flow speed of the $BCl_3$ is about 16 sccm, the flow speed of the $O_2$ is about 20 sccm, and the flow speed of the Ar is about 10 sccm.

More specifically, the second semiconductor layer 140 can be etched by the following steps:

(S7331), forming a plurality of grooves with the same depth by etching the surface of second semiconductor layer 140 with the etching gas;

(S7332), continuing the etching process so that every two adjacent protruding structures begin to slant face to face to form a protruding pair; and (S7333), further continuing the etching process so that the two adjacent protruding structures gradually slant until the tops of the two adjacent protruding structures contact each other.

In step (S7331), the etching gas etches the exposed surface of the second semiconductor layer 140 to form the plurality of grooves. The grooves have the same depth because of the same etching speed. During the etching process, the etching gas will react with the exposed second semiconductor layer 140 to form a protective layer. The protective layer will reduce the etching speed of the second semiconductor layer 140, and the width of the grooves will slowly decrease from the outer surface of the second semiconductor layer 140 to the bottom of the grooves. Thus, the inner wall of the grooves will not be absolutely perpendicular to the surface of the second semiconductor layer 140. The etching gas not only etches the second semiconductor layer 140, but also etches the top of the protruding structures. The width of the top of the protruding structures will decrease. The resolution of the mask layer will not be affected because the speed of etching the top of the protruding structures is much smaller than that of the second semiconductor layer 140. Furthermore, every two adjacent protruding structures will slant face to face.

In step (S7332), the tops of the two adjacent protruding structures will gradually approach to each other. The speed of etching the second semiconductor layer 140 corresponding to these two closed adjacent protruding structures will decrease, and the width of the grooves will gradually decrease from the outer surface of the second semiconductor layer 140 to the bottom of the grooves of the second semiconductor layer 140. Because the two adjacent protruding structures slant face to face to form the protruding pair, the speed of etching the second semiconductor layer 140 corresponding to the protruding pair will further decrease. Eventually, the tops of the two adjacent protruding structures contact each other, and the etching gas can no longer etch the second semiconductor layer 140 corresponding to the two adjacent protruding structures, thus the first grooves 1136 is formed on the surface of the second semiconductor layer 140. But between every two adjacent protruding pairs, the etching speed will change less than the etching speed between the slant two adjacent protruding structures. Thus the second grooves 1138 are formed, and the depth of the second grooves 1138 will be greater than that of the first grooves 1136. The plurality of three-dimensional nano-structure preforms is obtained.

In step (S734), the primary three-dimensional nano-structures 143 can be obtained by dissolving the mask layer. The mask layer can be dissolved in a stripping agent such as tetrahydrofuran (THF), acetone, butanone, cyclohexane, hexane, methanol, or ethanol. In one embodiment, the stripping agent is butanone, and the mask layer is dissolved in butanone and separated from the second semiconductor layer 140.

The plurality of primary three-dimensional nano-structures 143 also can be formed on the surface of the active layer 130 away from the first semiconductor layer 120 or the surface of the first semiconductor layer 120 adjacent to the active layer 130 by the above method. The protective layer 150 and the cermet layer 160 are directly grown on the surface of the plurality of three-dimensional nanostructures 133, thus the protective layer 150 and the cermet layer 160 also form a patterned surface.

In the method for making the LED 70, the nanoimprinting and etching method is used to form the plurality of primary three-dimensional nano-structures 143. The nanoimprinting process can be conducted in a room temperature and the template can be directly used without being pre-treated. Therefore, the method has a simple process and low cost. In addition, a large area array of the plurality of M-shaped primary three-dimensional nano-structures 143 can be fabricated for the two adjacent protruding structures of the mask layer can be contact with each other by the gas etching to form the plurality of protruding pairs. Therefore, a yield of the LED 70 can be increased.

Figure 12:
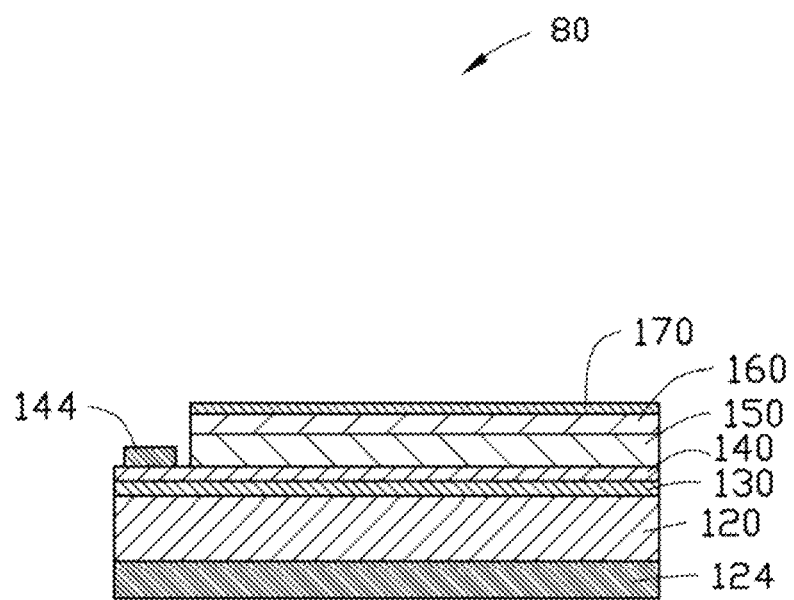
FIG. 12 is a schematic view of one embodiment of an LED.

Referring to FIG. 12, one embodiment of an LED 80 includes a first semiconductor layer 120, an active layer 130, a second semiconductor layer 140, a protective layer 150, and a cermet layer 160 stacked in that order. The first semiconductor layer 120 includes a first surface 121 and a second surface 122 opposite to the first surface. The active layer 130 is located on the second surface 122. A reflector layer 170 covers and directly contacts a surface of the cermet layer 160 away from the active layer 130. A first electrode 124 covers and directly contacts the first surface 121 of the first semiconductor layer 120 away from the active layer 130. A second electrode 144 is electrically connected to the second semiconductor layer 140.

The structure of LED 80 is similar to the structure of the LED 70, except that the structure of the LED 80 further includes the reflector layer 170 located on the cermet layer 160. The material of the reflector can be selected from Ti, Ag, Al, Ni, Au, or any combination thereof. The reflector layer 170 includes a smooth surface having a high reflectivity. The photons reach the reflector layer 170 and will be reflected, thus these photons can be extracted out of the LED 70, and the light extraction efficiency of the LED 70 through the first semiconductor layer 120 can be improved. The reflector layer 170 can also be a plurality of microstructures on the surface of the cermet layer 160. The microstructure can be a groove and a bulge. Furthermore, the first electrode 124 can be transparent.

Figure 13:
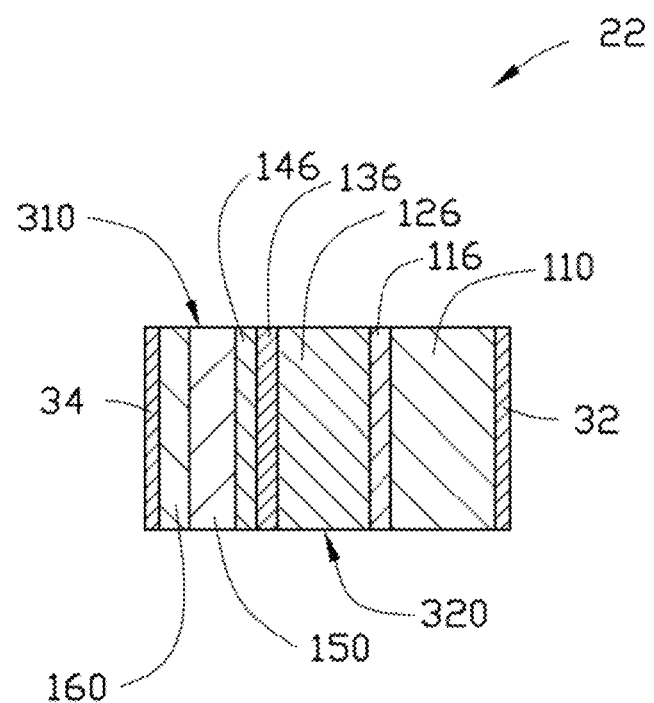
FIG. 13 is a schematic view of one embodiment of a solar cell.

Referring to FIG. 13, one embodiment of a solar cell 22 using semiconductor structure 10 includes a first collecting electrode 32, the substrate 110, the buffer layer 116, the first silicon layer 126, a photovoltaic layer 136, a second silicon layer 146, a protective layer 150, a cermet layer 160, and a second collecting electrode 34. The substrate 110, the buffer layer 116, the first silicon layer 126, the photovoltaic layer 136, the second silicon layer 146, the protective layer 150, and the cermet layer 160 are stacked on a surface of the first collecting electrode 32 in the listed sequence.

The semiconductor type of the first silicon layer 126 and the second silicon layer 146 are different. The first silicon layer 126 can be N-typed or P-typed. In one embodiment, the first silicon layer 126 is P-typed, and the second silicon layer 146 is N-typed.

The first collecting electrode 32 and the second collecting electrode 34 can be made with the same material or different materials. The first collecting electrode 32 or the second collecting electrode 34 can be a metal plate with a continuous surface. The material of the first collecting electrode 32 or the second collecting electrode 34 can be selected from the group consisting of Al, Cu, Ag, and combinations thereof. A thickness of the first collecting electrode 32 or the second collecting electrode 34 can be in a range from about 50 nanometers to about 300 nanometers. In one embodiment, both the first collecting electrode 32 and the second electrode 34 are bar-shaped Al foils with the thickness of about 200 nanometers.

The solar cell 22 includes a light-input surface 310 and a light-output surface 320. One side of the substrate 110, the buffer layer 116, the first silicon layer 126, the photovoltaic layer 136, the second silicon layer 146, the protective layer 150, and the cermet layer 160 constitute the light-input surface 310. An opposite side of the side of the substrate 110, the buffer layer 116, the first silicon layer 126, the photovoltaic layer 136, the second silicon layer 146, the protective layer 150, and the cermet layer 160 constitute the light-output surface 320 of the solar cell 22.

Sunlight irradiates the light-input surface 310 and reaches the cermet layer 160. The metallic plasma is then generated from the cermet layer 160. The metallic plasma is absorbed by a P-N conjunction formed by the first silicon layer 126 and the second silicon layer 136 to form larger amounts of electrons and holes. The electrons move to the second collecting electrode 34 and the holes move to the first collecting electrode 32 to form a current.

Figure 14:
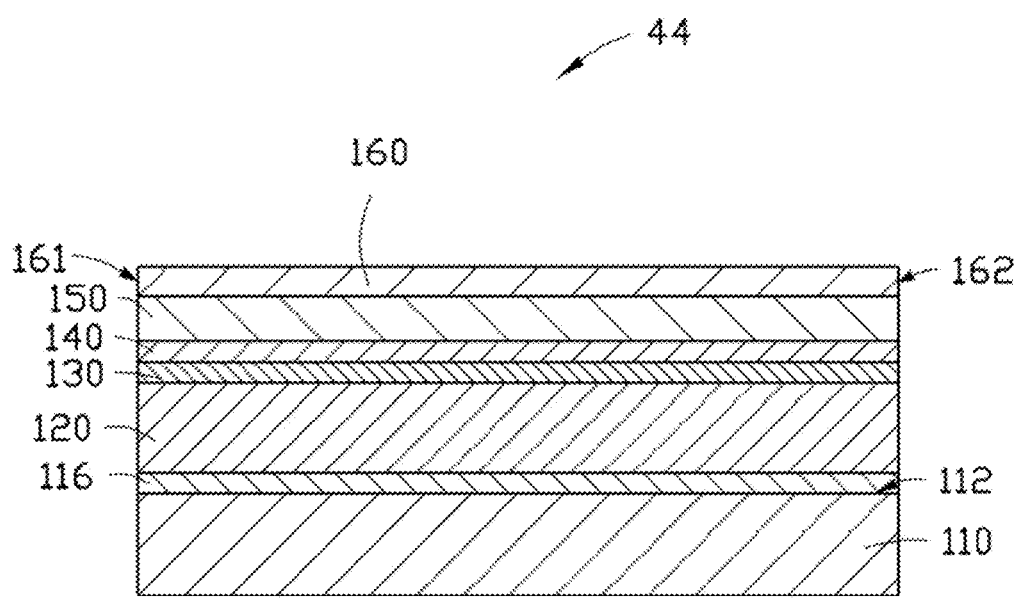
FIG. 14 is a schematic view of one embodiment of a wave guide tube.

Referring to FIG. 14, one embodiment of a waveguide tube 44 is provided. The waveguide tube 44 is substantially the same as the semiconductor structure 10. The cermet layer 160 of the waveguide tube 44 includes two substantially parallel and opposite sides: a first side 161 and a second side 162. Electromagnetic waves can enter from the first side 161 and pass through from the second side 162. The metallic plasma is generated when the electromagnetic waves reaches the cermet layer 160. The metallic plasma carrying information of the electromagnetic waves spreads in the cermet layer 160 and then converted back to the electromagnetic waves when reaching the second side 162. Therefore, the waveguide tube 44 can conduct the electromagnetic waves.

Figure 15:
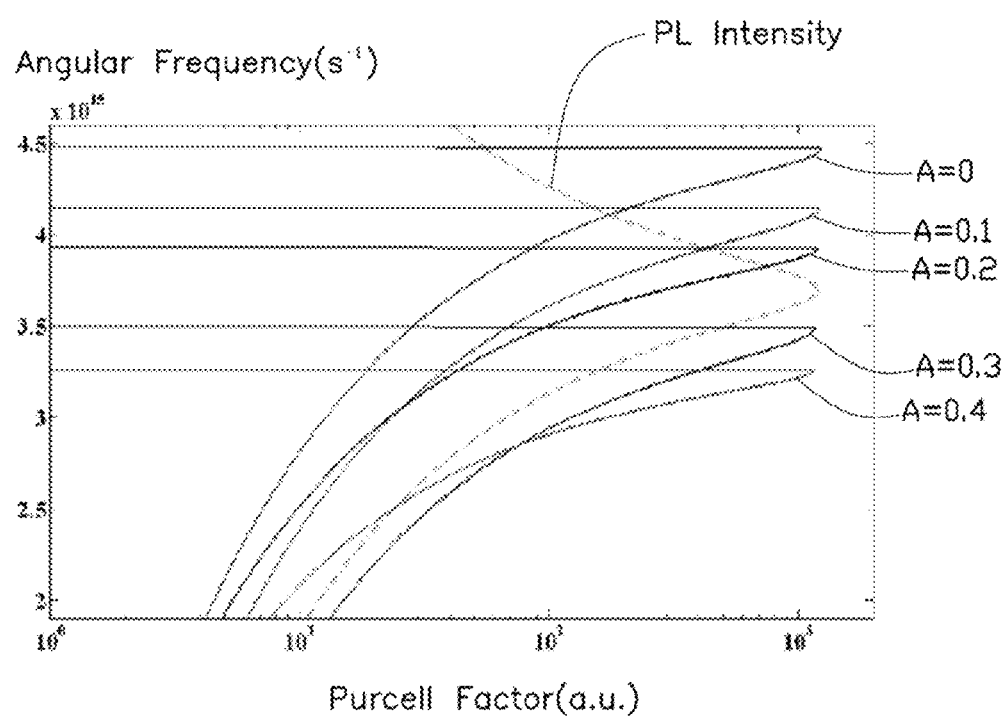
FIG. 15 is a figure that shows a relationship between the Angular frequency and the Purcell Factor of the LED of FIG. 7.

Referring to FIG. 15, a curve between the Angular frequency and the Purcell Factor of the LED 50 of FIG. 7 is shown. A mass percent of the silicon dioxide in the cermet layer 160 is defined as factor "A". The factor A can be 0%, 10%, 20%, 30%, 40%. A dotted line shows a photoluminescence intensity of LED 50. The smaller the distance between the curve line and the dotted line is, the more metallic plasma can be activated in the cermet layer 160. Thus, while the factor A is about 20% or about 30%, the cermet layer 160 generates more metallic plasma, and the light extraction efficiency of the LED 50 can be improved.

It is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A semiconductor structure comprising:
a first semiconductor layer;
an active layer on the first semiconductor layer;
a second semiconductor layer on the active layer; wherein a plurality of primary three-dimensional nano-structures is located on a surface of the second semiconductor layer away from the active layer, the plurality of primary three-dimensional nano-structures is aligned side by side, each of the plurality of primary three-dimensional nano-structures has a first peak and a second peak aligned side by side, a first groove is defined between the first peak and the second peak, a second groove is defined between every two adjacent primary three-dimensional nano-structures, a depth of the first groove is smaller than a depth of the second groove, and a cross section of each of the plurality of the primary three-dimensional nano-structures is M-shaped; and
a cermet layer on the second semiconductor layer, wherein the cermet layer is located on the second semiconductor layer, wherein a refractive index of the cermet layer is a complex number comprising a first real part and a first imaginary part, and the first imaginary part is greater than or smaller than 0, and a dielectric constant of the cermet layer is a complex number comprising a second real part and a second imaginary part, the second real part of the dielectric constant is a negative number, and the second imaginary part is greater than or smaller than 0.

2. The semiconductor structure of claim 1, wherein a material of the cermet layer comprises a metal material and a dielectric material.

3. The semiconductor structure of claim 2, wherein a mass percent of the dielectric material is smaller than or equal to 40%.

4. The semiconductor structure of claim 2, wherein the metal material is selected from the group consisting of gold, silver, aluminum, copper, and alloy thereof.

5. The semiconductor structure of claim 2, wherein the dielectric material is selected from the group consisting of silicon, silicon dioxide, and ceramic.

6. The semiconductor structure of claim 2, wherein the cermet layer comprises silver and silicon dioxide.

7. The semiconductor structure of claim 6, wherein a mass percent of the silicon dioxide is about 20%.

8. The semiconductor structure of claim 1, wherein the cermet layer is stacked on the plurality of primary three-dimensional nano-structures.

9. The semiconductor structure of claim 8, wherein a surface of the cermet layer has a plurality of secondary three-dimensional nano-structures, and a distribution and alignment of the secondary three-dimensional nano-structures is the same as a distribution and alignment of the primary three-dimensional nano-structures.

10. The semiconductor structure of claim 1, further comprising a plurality of the primary three-dimensional nano-structures on a surface of the first semiconductor layer or a surface of the active layer.

11. The semiconductor structure of claim 1, wherein the semiconductor structure is configured as a solar cell.

12. The semiconductor structure of claim 1, wherein the semiconductor structure is configured as a waveguide tube.

13. The semiconductor structure of claim 1, wherein the cermet layer is in direct physical contact with the second semiconductor layer.

* * * * *